United States Patent
Hung et al.

(10) Patent No.: US 12,513,997 B2
(45) Date of Patent: Dec. 30, 2025

(54) LAYOUT PATTERN OF SEMICONDUCTOR CELL AND FORMING METHOD THEREOF

(71) Applicant: UNITED MICROELECTRONICS CORP., Hsin-Chu (TW)

(72) Inventors: Ching-Wen Hung, Tainan (TW); Peng-Hsiu Chen, Tainan (TW); Su-Ming Hsieh, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 486 days.

(21) Appl. No.: 18/105,888

(22) Filed: Feb. 6, 2023

(65) Prior Publication Data
US 2024/0222355 A1 Jul. 4, 2024

(30) Foreign Application Priority Data
Dec. 28, 2022 (TW) .................................. 111150259

(51) Int. Cl.
*H10D 89/10* (2025.01)
*H10D 30/01* (2025.01)
*H10D 30/47* (2025.01)
*H10D 62/10* (2025.01)
*H10D 84/82* (2025.01)

(52) U.S. Cl.
CPC ............ *H10D 89/10* (2025.01); *H10D 30/015* (2025.01); *H10D 30/475* (2025.01); *H10D 62/126* (2025.01); *H10D 84/82* (2025.01)

(58) Field of Classification Search
CPC ............. H10D 30/475; H10D 30/4755; H10D 30/015; H10D 89/10; H10D 62/126; H10D 84/82
See application file for complete search history.

(56) References Cited

U.S. PATENT DOCUMENTS 9,379,191 B2  6/2016  Hsu

FOREIGN PATENT DOCUMENTS

CN     103872044     6/2014

*Primary Examiner* — Grant S Withers
(74) *Attorney, Agent, or Firm* — Winston Hsu (57) ABSTRACT

The invention provides a layout pattern of a semiconductor cell, which comprises a substrate with a first L-shaped MESA region and a second L-shaped MESA region, wherein the shapes of the first L-shaped MESA region and the second L-shaped MESA region are mutually inverted by 180 degrees, a first high electron mobility transistor (HEMT) and a second high electron mobility transistor are located on the first L-shaped MESA region, and a third high electron mobility transistor and a fourth high electron mobility transistor are located on the second L-shaped MESA region.

20 Claims, 7 Drawing Sheets

LAYOUT PATTERN OF SEMICONDUCTOR CELL AND FORMING METHOD THEREOF

BACKGROUND OF THE INVENTION

1. Field of the Invention

The present invention relates to semiconductor field, in particular to a layout pattern composed of high electron mobility transistor (HEMT) and its forming method.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the 2DEG.

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

The invention provides a layout pattern of a semiconductor cell, which comprises a substrate with a first L-shaped MESA region and a second L-shaped MESA region, wherein the shapes of the first L-shaped MESA region and the second L-shaped MESA region are mutually inverted by 180 degrees; a first high electron mobility transistor (HEMT) and a second high electron mobility transistor are located on the first L-shaped MESA region, and a third high electron mobility transistor and a first high electron mobility transistor are located on the first L-shaped MESA region.

The present invention also provides a method for forming a layout pattern of a semiconductor cell, which comprises providing a substrate, wherein a first L-shaped MESA region and a second L-shaped MESA region are formed on the substrate, wherein the shapes of the first L-shaped MESA region and the second L-shaped MESA region are mutually inverted by 180 degrees to form a first high electron mobility transistor (HEMT) and a second high electron mobility transistor on the first L-shaped MESA region, and a third high electron mobility transistor and a fourth high electron mobility transistor are formed on the second L-shaped MESA region.

The feature of the present invention is to provide a layout pattern of a semiconductor cell, which is composed of two enhancement mode high electron mobility transistors (E-mode HEMT) and two depletion mode high electron mobility transistors (D-mode HEMT). It can be used for electronic components such as inverters or oscillators. The MESA region of the semiconductor cell is an L-shaped pattern with two patterns corresponding to each other (the two patterns are reversed by 180 degrees), so the semiconductor cells are arranged more closely to achieve the effect of saving space.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
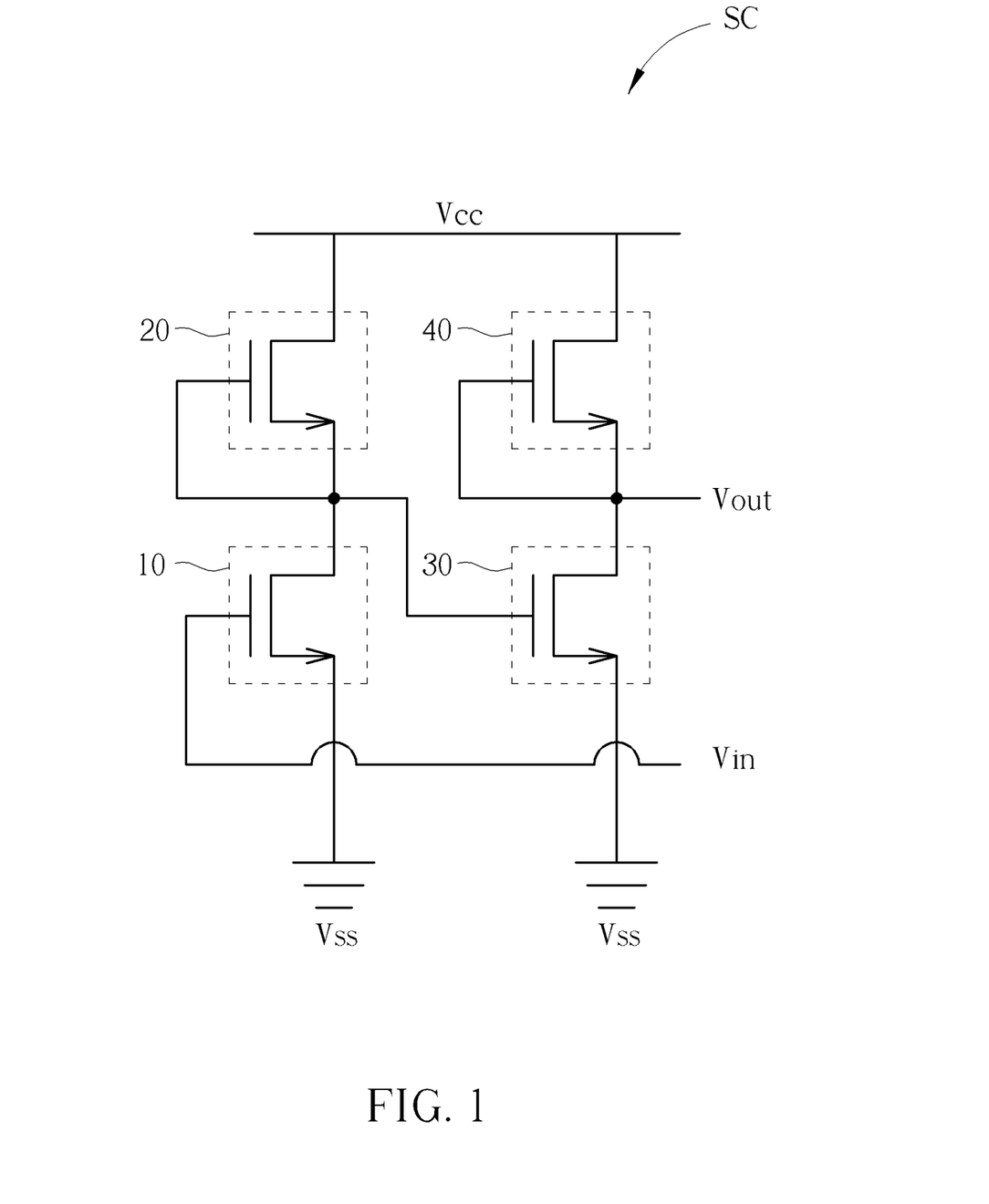
FIG. 1 shows a circuit diagram of a semiconductor cell of the present invention.

Please refer to FIG. 1, which shows the circuit diagram of the semiconductor cell of the present invention. As shown in FIG. 1, the circuit diagram of the semiconductor cell SC provided by the present invention includes four high electron mobility transistors (HEMTs), which are respectively labeled as a HEMT 10, a HEMT 20, a HEMT 30 and a HEMT 40. The HEMT 10 and the HEMT 30 are enhanced mode HEMTs (E-mode HEMT for short), while the HEMT 20 and the HEMT 40 are depletion mode HEMTs (D-mode HEMT for short). The main difference between the enhanced mode HEMT and the depleted mode HEMT is that the structure and operation mode are different, in which the enhanced mode HEMT is a normally off HEMT, while the depleted mode HEMT is a normally on HEMT. There are two kinds of the HEMTs, and more descriptions will be mentioned in the following paragraphs.

As shown in FIG. 1, the gate of the HEMT 10 is connected to an input voltage Vin, the gate of the HEMT 40 is connected to an output voltage Vout, and the gate of the HEMT 20 and the gate of the HEMT 30 are connected to each other. In addition, a voltage source Vcc and a voltage source Vss are also provided, the voltage source Vcc is electrically connected with the source of the HEMT 20 and the source of the HEMT 40, and the voltage source Vss, for example, is a ground potential and connects the drain of the HEMT 10 and the drain of the HEMT 30. In addition, the source of the HEMT 10 is connected to the drain of the HEMT 20, and the source of the HEMT 30 is connected to the drain of the HEMT 40.

The circuit diagram shown in FIG. 1 is the circuit diagram of the smallest semiconductor cell SC of the present invention, and it can be connected in series with other semiconductor cells with the same structure to form an inverter or a ring oscillator in electronic components. The present invention is not limited to its practical application range. The following paragraphs will continue to describe the layout pattern of the semiconductor cell shown in FIG. 1 and its manufacturing method.

Figure 2:
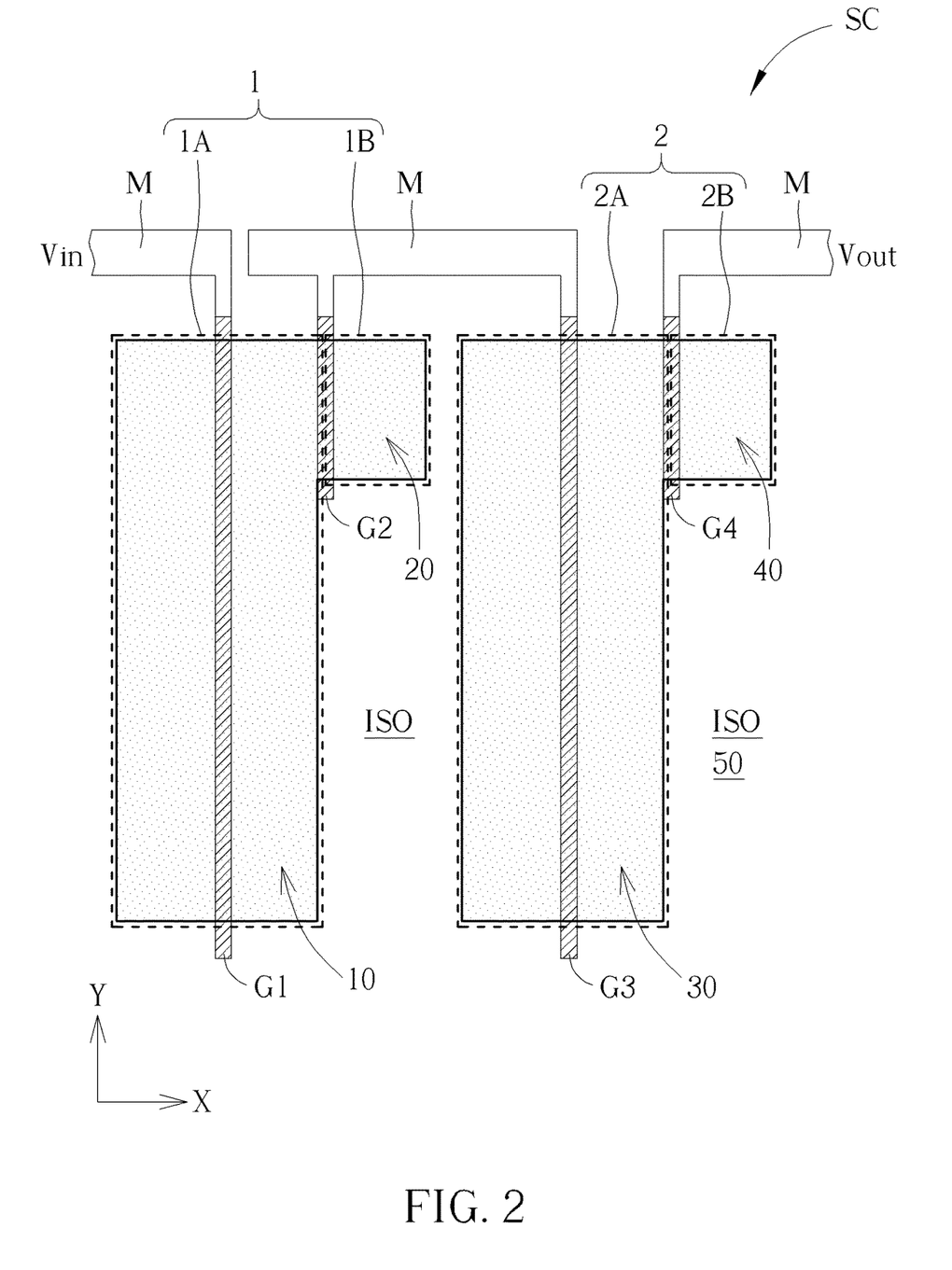
FIGS. 2 to 3 are schematic diagrams of layout patterns of semiconductor cells in the first embodiment of the present invention.
Figure 3:
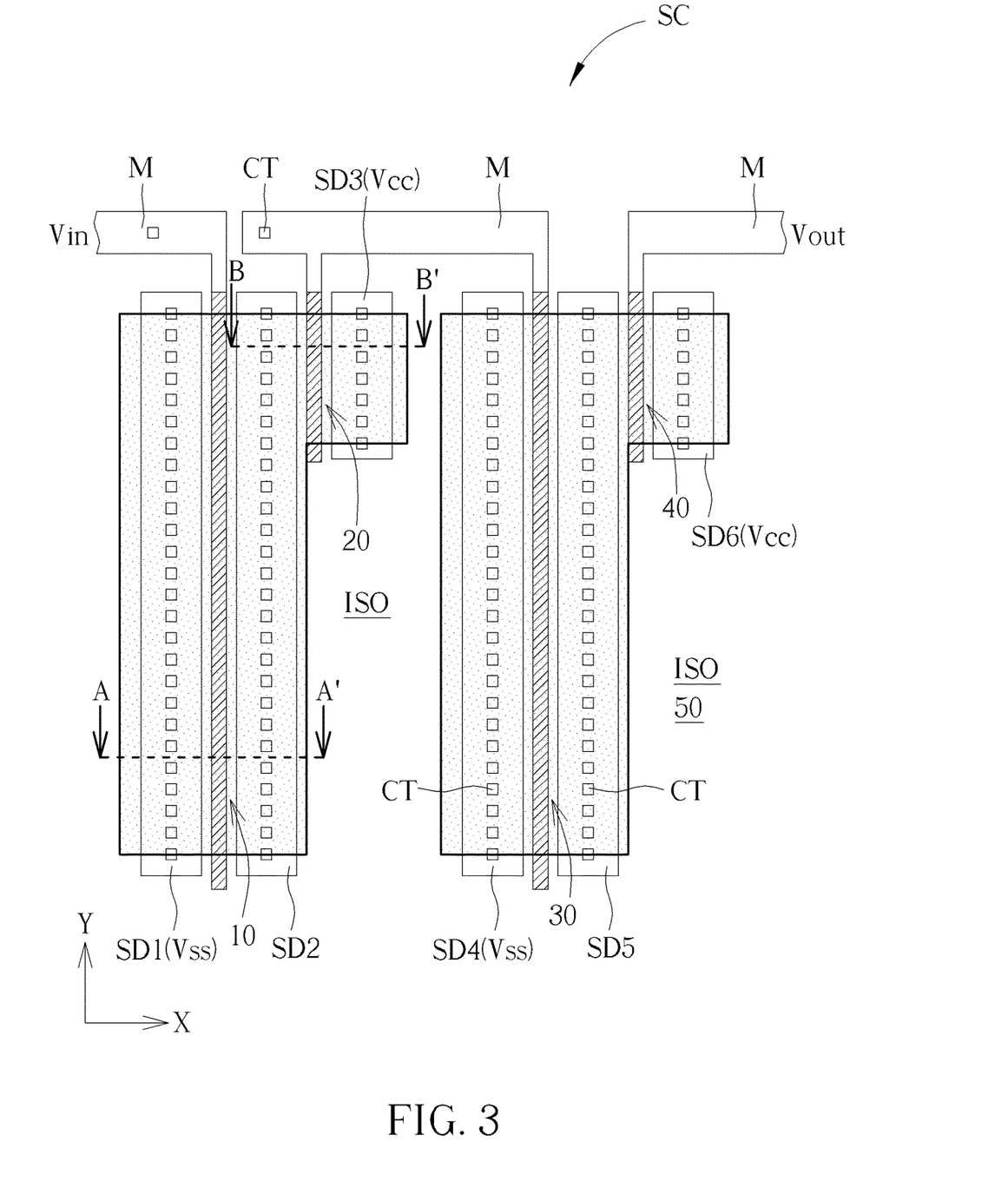

FIGS. 2 to 3 are schematic diagrams of layout patterns of semiconductor cells in accordance with the first embodiment of the present invention, and the layout patterns of semiconductor cells SC shown in FIGS. 2 to 3 correspond to the circuit diagram shown in FIG. 1. As shown in FIG. 2, manufacturing the semiconductor cell SC includes the following steps: firstly, providing a substrate 50, on which two MESA regions (the MESA region of the present invention can be simply referred to as an active region) are formed, namely, an L-shaped MESA region 1 and an L-shaped MESA region 2 are respectively formed, and an insulating region ISO is included around the periphery of the L-shaped MESA region 1 and the L-shaped MESA region 2. The L-shaped MESA region 1 and the L-shaped MESA region 2 are both L-shaped structures. Furthermore, the L-shaped MESA region 1 can comprise two parts: a first main part 1A and a first extension part 1B. Similarly, the L-shaped MESA region 2 can also include two parts: the second main part 2A and the second extension part 2B. The area of the first main part 1A and the second main part 2A is larger than that of the first extension part 1B and the second extension part 2B, and the first main part 1A and the second main part 2A are arranged in parallel with each other. The first extension part 1B connects the first main part 1A and forms an L-shaped structure. Similarly, the second extension part 2B connects the second main part 2A and forms another L-shaped structure. In this embodiment, the L-shaped MESA region 1 and the L-shaped MESA region 2 are arranged in the same direction (for example, in FIG. 2, the first extension part 1B and the second extension part 2B are located at the upper right of the first main part 1A and the second main part 2A, respectively).

With reference to FIG. 2, the HEMT 10 and the HEMT 20 are formed on the L-shaped MESA region 1, while the HEMT 30 and the HEMT 40 are formed on the L-shaped MESA region 2. The gate G1 of the HEMT 10 is formed on the first main part 1A, the gate G2 of the HEMT 20 is formed on the first extension part 1B, the gate G3 of the HEMT 30 is formed on the L-shaped MESA region 2A, and the gate of the HEMT 40 is formed on the second extension part 2B. In addition, after the gates G1, G2, G3 and G4 are formed, a conductive layer M is also formed, wherein the conductive layer M is used for electrically connecting the gates G1, G2, G3 and G4, such as electrically connecting the gate G1 with the input voltage Vin, electrically connecting the gate G4 with the output voltage Vout, or connecting the gate G2 and the gate G3 with each other.

As shown in FIG. 3, a plurality of source/drain regions and a plurality of contact structures CT are continuously formed on the L-shaped MESA region 1, the L-shaped MESA region 2 or the conductive layer M. The source/drain regions are located on both sides of the gate structures G1-G4. Taking FIG. 3 as an example, six source/drain regions are formed. For clarity, the six source/drain regions are respectively labeled as the source/drain region SD1, the source/drain region SD2, the source/drain region SD3, the source/drain region SD4, the source/drain region SD5 and the source/drain region SD6. In addition, a plurality of contact structures CT are formed on each source/drain region S/D (including the source/drain regions SD1-SD6) and the conductive layer M, the contact structures CT are metal or other conductive materials with good conductivity, and are used for connecting the gates G1-G4, the source/drain regions SD1-SD6 and other voltage sources (such as input voltage Vin, output voltage Vout, voltage source Vcc, Vss, etc.) The material characteristics and fabrication methods of the gate, the source/drain regions and the contact structures described here belong to the conventional technology in the field, and are not repeated here.

Subsequently, other elements (not shown), such as metal lines, can be continuously formed in the layout pattern of FIG. 3 to electrically connect the above-mentioned gate and the source/drain regions with voltage sources. The pattern of the metal circuit can be adjusted according to actual requirements, and the invention is not limited to the pattern of the metal circuit. In addition, for convenience of representation, some components in FIG. 3 are marked with voltage sources Vin, Vout, Vcc, Vss, etc., which represent the voltage sources connected to the components.

Figure 4:
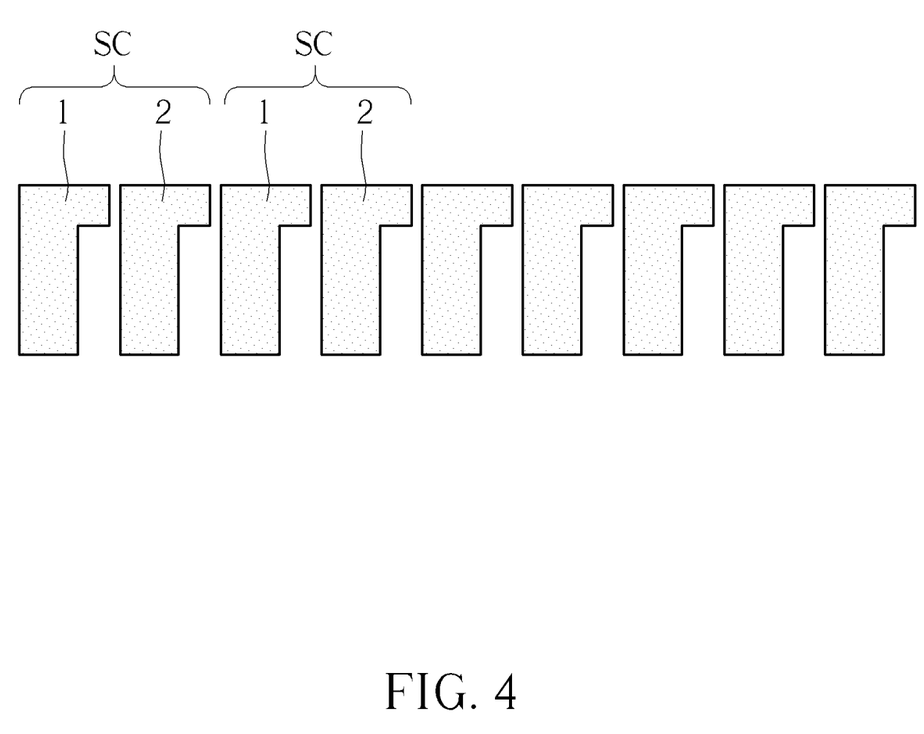
FIG. 4 shows a schematic diagram of a plurality of semiconductor cells SC arranged repeatedly.

In addition, the semiconductor cells SC of the present invention can be repeatedly arranged, for example, as shown in FIG. 4, which shows a schematic diagram of a plurality of repeatedly arranged semiconductor cells SC. As mentioned above, the semiconductor cell SC of the present invention can be connected in series with other semiconductor cells with the same structure to form an inverter or a ring oscillator in electronic components. In addition, for the sake of simplicity, in FIG. 4, only the L-shaped MESA region 1 and the L-shaped MESA region 2 of each semiconductor cell SC are simply drawn, and other detailed elements are omitted. It is worth noting that the L-shaped MESA region 1 and the L-shaped MESA region 2 are arranged in the same direction.

Figure 5:
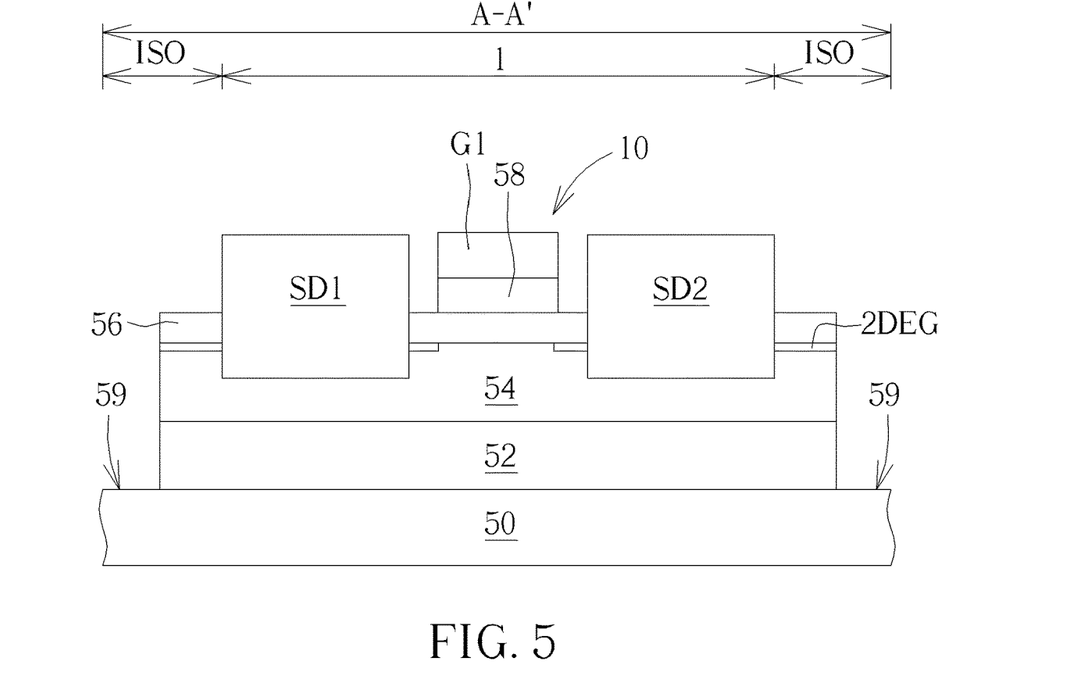
FIG. 5 is a sectional view taken along the section line A-A' of FIG. 3.
Figure 6:
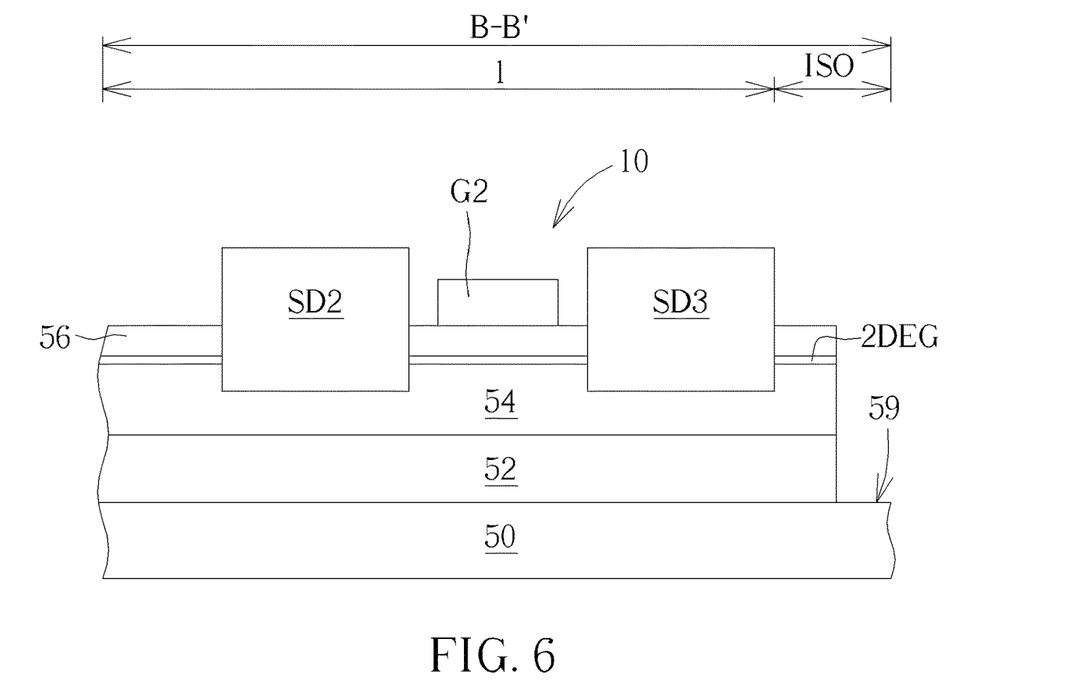
FIG. 6 is a sectional view taken along the section line B-B' of FIG. 3.

In addition, the main difference between the above-mentioned enhanced mode HEMT and the depletion mode HEMT is that the structures and the operation mode are different, in which the enhanced mode HEMT is a normally off HEMT, while the depletion mode HEMT is a normally on HEMT. Further, please refer to FIG. 5 and FIG. 6, in which FIG. 5 shows a cross-sectional view along the section line A-A' of FIG. 3, and also represents a cross-sectional structure of an enhanced mode HEMT (such as HEMT 10), while FIG. 6 shows a cross-sectional view along the section line B-B' of FIG. 3, and also represents a cross-sectional structure of an depleted mode HEMT (such as HEMT 20). As shown in FIG. 5 or FIG. 6, both the enhanced mode HEMT 10 and the depleted mode HEMT 20 are located on a substrate 50, and the substrate 50 may optionally include a buffer layer 52, wherein the buffer layer 52 may be a single layer or a multi-layer structure, and in some embodiments, the buffer layer 52 may be omitted. The buffer layer 52 is, for example, an insulating layer such as silicon oxide, silicon nitride, silicon oxynitride, or an organic dielectric layer, and the present invention is not limited thereto. Then, a gallium nitride (GaN) layer 54 and an aluminum gallium nitride (AlGaN) layer 56 are formed on the buffer layer 52.

It should be noted that after the aluminum gallium nitride layer 56 is formed on the surface of the gallium nitride layer 54, the interface number between the gallium nitride layer 54 and the aluminum gallium nitride layer 56 preferably forms a heterojunction because of the different band gap between the materials of the gallium nitride layer 54 and the aluminum gallium nitride layer 56. The energy band at the heterojunction is bent, and the conduction band is bent deep to form a quantum well, and the electrons generated by piezoelectricity effect are confined in the quantum well. Therefore, a channel region or a two-dimensional electron gas (2DEG) layer is formed at the interface between the gallium nitride layer 54 and the aluminum gallium nitride layer 56, and the 2DEG layer allows current to flow when it is formed, so it can be regarded as a conductive channel.

The difference between the enhanced mode HEMT (E-mode HEMT) of the present invention and the depletion mode HEMT (D-mode HEMT) is that another gallium nitride (GaN) layer 58 is formed above the AlGaN layer 56 of the enhanced mode HEMT, and the gate G1 is formed on the GaN layer 58. On the other hand, the gallium nitride (GaN) layer is not formed on the aluminum gallium nitride (AlGaN) layer 56 of the depletion mode HEMT, but the gate G2 is directly formed. Here, the gallium nitride layer 58 of the enhanced mode HEMT is formed on the aluminum gallium nitride layer 56, and the gallium nitride layer 58 will affect the formation of the lower 2DEG, that is, the lower part of the gallium nitride layer 58 will not form a 2DEG layer, so that the conduction path of the 2DEG is cut off, and when a voltage is applied to the gate G1, the 2DEG can be reformed to form a conduction path, that is, the HEMT is turned on. Therefore, the enhanced mode HEMT is a normally off HEMT. On the other hand, the depletion mode HEMT does not include the gallium nitride layer formed on the aluminum gallium nitride layer 56, so the 2DEG will not be cut off, but when a voltage is applied to the gate G2, the 2DEG will be cut off and the HEMT will be turned off. Therefore, the depletion mode HEMT is normally on.

In addition, as shown in FIGS. 5 and 6, the insulating region ISO outside the L-shaped MESA region 1 is the region that does not contain the 2DEG. The insulating region ISO may be a groove or a groove which is filled by insulating materials. More specifically, the gallium nitride layer 54 and the aluminum gallium nitride layer 56 can be removed by an etching step to form a groove 59, or the groove 59 can be filled with an insulating material (such as silicon oxide). All the above embodiments are within the scope of the present invention.

In the above embodiment, the gate G1 is formed after the gallium nitride layer 58 is formed in the enhanced mode HEMT (such as the HEMT 10 in FIG. 5), while the gate G2 is directly formed without the gallium nitride layer 58 in the depleted mode HEMT (such as the HEMT 20 in FIG. 6). However, in other embodiments of the present invention, the gallium nitride layer 58 may be formed in both the HEMT 10 and the HEMT 20 first, and then the gallium nitride layer 58 in the HEMT 20 may be removed by an etching process, but the gallium nitride layer 58 in the HEMT 10 may remain, and then the gates G1 and G2 may be formed. This embodiment also belongs to the scope of the present invention.

In the first embodiment described above, a layout pattern of a semiconductor cell and a manufacturing method thereof are provided. In other embodiments of the present invention, further improvements are made based on the above-mentioned first embodiment. For the convenience of describing the differences between different embodiments, in the following embodiments, the same elements as those in the first embodiment are denoted by the same reference numerals. And the following paragraphs will focus on the differences between different embodiments, and the similarities with the first embodiment will not be repeated.

Figure 7:
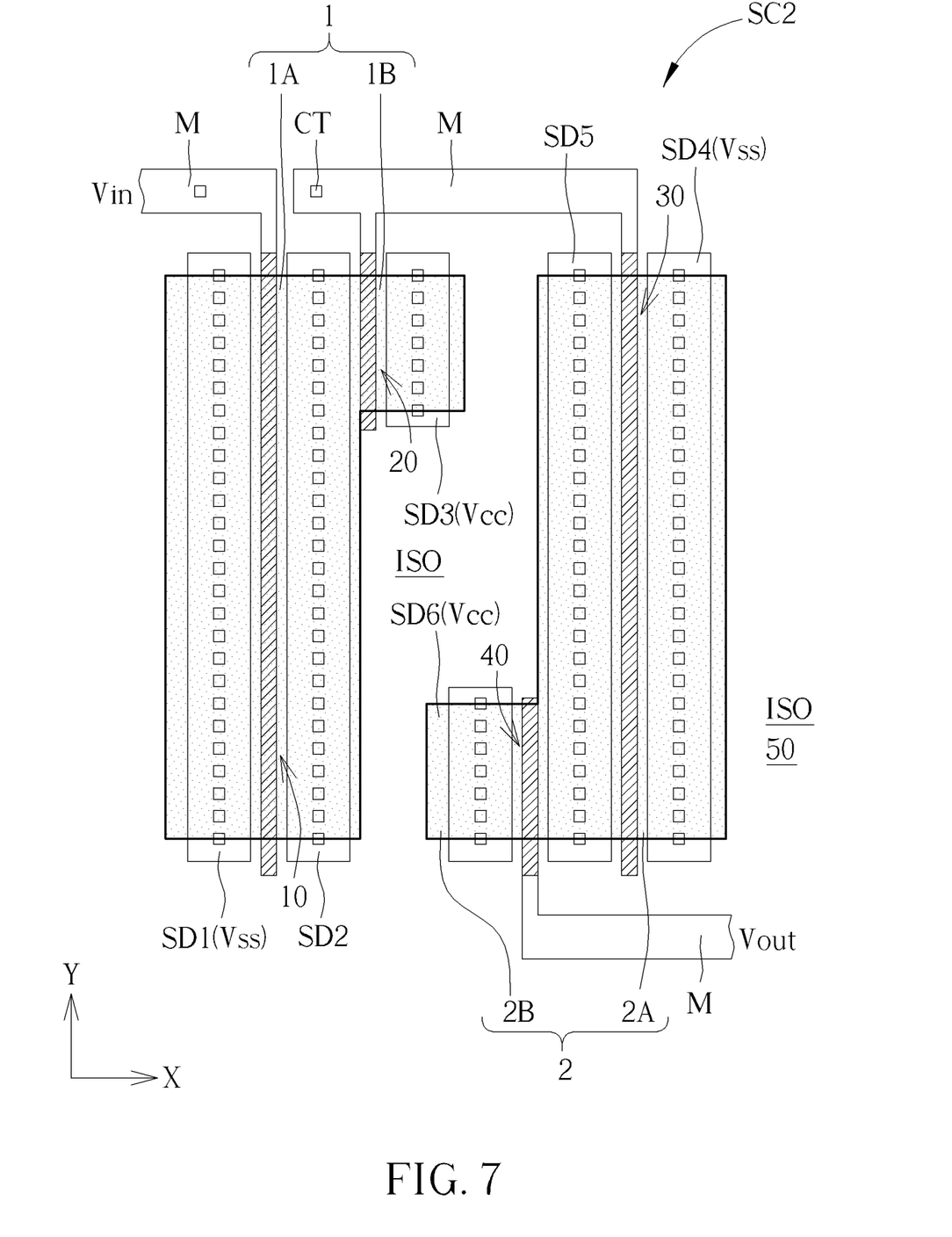
FIG. 7 is a schematic diagram of a layout pattern of a semiconductor cell according to a second embodiment of the present invention.

Please refer to FIG. 7, which is a schematic diagram of the layout pattern of the semiconductor cell according to the second embodiment of the present invention. As shown in FIG. 7, the layout pattern of this embodiment is similar to that of the first embodiment (FIG. 3). The semiconductor cell SC2 also includes two L-shaped MESA regions 1 and 2, and the HEMT 10, the HEMT 20, the HEMT 30 and the HEMT 40 are formed on the L-shaped MESA region 1 or the L-shaped MESA region 2. The difference between this embodiment and the first embodiment is that the L-shaped MESA region 1 and the L-shaped MESA region 2 in this embodiment are arranged in a 180-degree inverted manner. Taking FIG. 7 as an example, in this embodiment, the first extension part 1B is located at the upper right of the first main part 1A, but the second extension part 2B is located at the lower left of the second main part 2A. In this way, the L-shaped MESA region 1 and the L-shaped MESA region 2 can be arranged more closely, and the space between the L-shaped MESA region 1 and the L-shaped MESA region 2 (i.e. the area of the insulating region ISO) can be reduced.

Figure 8:
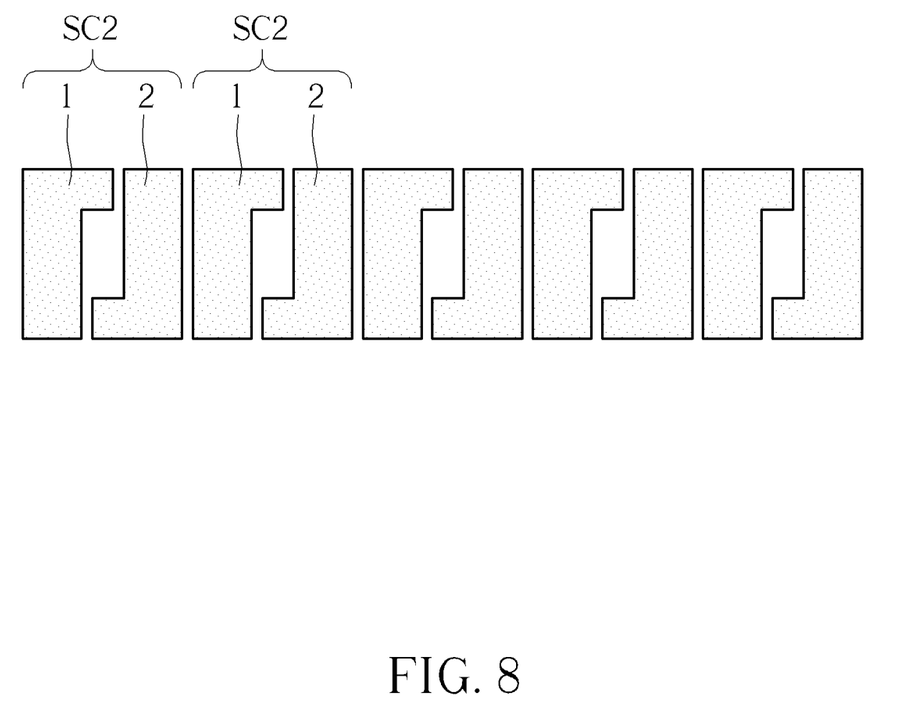
FIG. 8 shows a schematic diagram of a plurality of semiconductor cells SC2 arranged repeatedly.

When the semiconductor cell SC2 shown in FIG. 7 is arranged with other same semiconductor cells, the gap with the adjacent semiconductor cells can be reduced. More specifically, please refer to FIG. 8, which shows a schematic diagram of a plurality of semiconductor cells SC2 repeatedly arranged. For the sake of brevity, in FIG. 8, only the L-shaped MESA region 1 and L-shaped MESA region 2 of each semiconductor cell SC2 are simply drawn, and other detailed elements are omitted, and the L-shaped MESA region 1 and L-shaped MESA region 2 are arranged in the direction of 180 degrees turning over each other. According to the applicant's experiment, the effective area of the whole electronic component can be increased by about 15% by arranging the L-shaped MESA region 1 and the L-shaped MESA region 2 as shown in FIG. 8. Therefore, compared with the first preferred embodiment, more semiconductor cells can be accommodated in a limited space, which helps to reduce the volume and the manufacturing cost.

According to the above description and drawings, the present invention provides a layout pattern of a semiconductor cell, which comprises a substrate 50 with a first L-shaped MESA region 1 and a second L-shaped MESA region 2, wherein the shapes of the first L-shaped MESA region 1 and the second L-shaped MESA region 2 are reversed by 180 degrees (see FIG. 6). A first HEMT 10 and a second HEMT 20 are located on the first L-shaped MESA region 1, and a third HEMT 30 and a fourth HEMT 40 are located on the second L-shaped MESA region 2.

The present invention also provides a method for forming a layout pattern of a semiconductor cell, which comprises providing a substrate 50, on which a first L-shaped MESA region 1 and a second L-shaped MESA region 2 are formed, wherein the shapes of the first L-shaped MESA region 1 and the second L-shaped MESA region 2 are inverted by 180 degrees to form a first high electron mobility transistor, HEMT 10 and a second high electron mobility transistor 20 on the first L-shaped MESA region 1, and a third high electron mobility transistor 30 and a fourth high electron mobility transistor 40 are formed on the second L-shaped MESA region 2.

In some embodiments of the present invention, the first high electron mobility transistor 10 and the third high electron mobility transistor 30 comprise enhancement mode HEMT (E-mode HEMT), and the second high electron mobility transistor 20 and the fourth high electron mobility transistor 40 comprise depletion mode HEMT (D-mode HEMT).

In some embodiments of the present invention, the first high electron mobility transistor 10 and the third high electron mobility transistor 30 comprise a stack layer of a gallium nitride (GaN) layer 54, an aluminum gallium nitride (AlGaN) layer 56 and another gallium nitride (GaN) layer 58, while the second high electron mobility transistor 20 and the fourth high electron mobility transistor 40 comprise a stack layer of a gallium nitride (GaN) layer 54 and an aluminum gallium nitride (AlGaN) 56.

In some embodiments of the present invention, the first L-shaped MESA region 1 includes a first main part 1A and a first extension part 1B, and the second L-shaped MESA region includes a second main part 2A and a second extension part 2B, wherein the first main part 1A and the second main part 2A are arranged in parallel with each other.

In some embodiments of the present invention, the first extension part 1B and the second extension part 2B are located between the first main part 1A and the second main part 2A (as shown in FIG. 6).

In some embodiments of the present invention, the first high electron mobility transistor 10 is located on the first main part 1A, the second high electron mobility transistor 20 is located on the first extended part 1B, the third high electron mobility transistor 30 is located on the second main part 2A, and the fourth high electron mobility transistor 40 is located on the second extended part 2B.

In some embodiments of the present invention, the first high electron mobility transistor 10 and the second high electron mobility transistor 20 share one source/drain region SD2, and the third high electron mobility transistor and the fourth high electron mobility transistor share another source/drain region SD5.

In some embodiments of the present invention, a gate G2 of the second high electron mobility transistor 20 is connected to a gate G3 of the third high electron mobility transistor 30.

In some embodiments of the present invention, a gate G1 of the first high electron mobility transistor 10 is connected to an input voltage Vin, and a gate G4 of the fourth high electron mobility transistor 40 is connected to an output voltage Vout.

In some embodiments of the present invention, a groove 59 is located around the first L-shaped MESA region 1 and the second L-shaped MESA region 2.

The feature of the present invention is to provide a layout pattern of a semiconductor cell, which is composed of two enhancement mode high electron mobility transistors (E-mode HEMT) and two depletion mode high electron mobility transistors (D-mode HEMT). It can be used for electronic components such as inverters or oscillators. The MESA region of the semiconductor cell is an L-shaped pattern with two patterns corresponding to each other (the two patterns are reversed by 180 degrees), so the semiconductor cells are arranged more closely to achieve the effect of saving space.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a semiconductor cell, comprising:
   a substrate with a first L-shaped MESA region and a second L-shaped MESA region, wherein the shape of the first L-shaped MESA region and the shape of the second L-shaped MESA region are mutually inverted by 180 degrees;
   a first high electron mobility transistor (HEMT) and a second high electron mobility transistor are located on the first L-shaped MESA region; and
   a third high electron mobility transistor and a fourth high electron mobility transistor are located on the second L-shaped MESA region.

2. The layout pattern of the semiconductor cell according to claim 1, wherein the first high electron mobility transistor and the third high electron mobility transistor comprise an enhancement mode HEMT (E-mode HEMT), and the second high electron mobility transistor and the fourth high electron mobility transistor comprise a depletion mode HEMT (D-mode HEMT).

3. The layout pattern of the semiconductor cell according to claim 2, wherein the first high electron mobility transistor and the third high electron mobility transistor comprise a stacked layer of gallium nitride (GaN), an aluminum gallium nitride (AlGaN) layer and another gallium nitride (GaN) layer, while the second high electron mobility transistor and the fourth high electron mobility transistor comprise a stacked layer of a gallium nitride (GaN) layer and an aluminum gallium nitride (AlGaN) layer.

4. The layout pattern of the semiconductor cell according to claim 1, wherein the first L-shaped MESA region comprises a first main part and a first extension part, and the second L-shaped MESA region comprises a second main part and a second extension part, wherein the first main part and the second main part are arranged in parallel with each other.

5. The layout pattern of the semiconductor cell according to claim 4, wherein the first extension part and the second extension part are located between the first main part and the second main part.

6. The layout pattern of the semiconductor cell according to claim 4, wherein the first high electron mobility transistor is located on the first main part, the second high electron mobility transistor is located on the first extension part, the third high electron mobility transistor is located on the second main part, and the fourth high electron mobility transistor is located on the second extension part.

7. The layout pattern of a semiconductor cell according to claim 1, wherein the first high electron mobility transistor and the second high electron mobility transistor share one source/drain region, and the third high electron mobility transistor and the fourth high electron mobility transistor share another source/drain region.

8. The layout pattern of a semiconductor cell according to claim 1, wherein a gate of the second high electron mobility transistor is connected to a gate of the third high electron mobility transistor.

9. The layout pattern of a semiconductor cell according to claim 1, wherein a gate of the first high electron mobility transistor is connected to an input voltage, and a gate of the fourth high electron mobility transistor is connected to an output voltage.

10. The layout pattern of the semiconductor cell according to claim 1, further comprising a groove around the first L-shaped MESA region and the second L-shaped MESA region.

11. A method for forming a layout pattern of a semiconductor cell, comprising:
providing a substrate on which a first L-shaped MESA region and a second L-shaped MESA region are formed, wherein the shapes of the first L-shaped MESA region and the second L-shaped MESA region are mutually inverted by 180 degrees;
forming a first high electron mobility transistor (HEMT) and a second HEMT on the first L-shaped MESA region; and
forming a third high electron mobility transistor and a fourth high electron mobility transistor on the second L-shaped MESA region.

12. The method for forming a layout pattern of a semiconductor cell according to claim 11, wherein the first high electron mobility transistor and the third high electron mobility transistor comprise an enhancement mode HEMT (E-mode HEMT), and the second high electron mobility transistor and the fourth high electron mobility transistor comprise a depletion mode HEMT (D-mode HEMT).

13. The method for forming a layout pattern of a semiconductor cell according to claim 12, wherein the first high electron mobility transistor and the third high electron mobility transistor comprise a stack layer of gallium nitride (GaN), an aluminum gallium nitride (AlGaN) layer and another gallium nitride (GaN) layer, while the second high electron mobility transistor and the fourth high electron mobility transistor comprise a stacked layer of a gallium nitride (GaN) layer and an aluminum gallium nitride (AlGaN) layer.

14. The method for forming a layout pattern of a semiconductor cell according to claim 11, wherein the first L-shaped MESA region comprises a first main part and a first extension part, and the second L-shaped MESA region comprises a second main part and a second extension part, wherein the first main part and the second main part are arranged in parallel with each other.

15. The method for forming a layout pattern of a semiconductor cell according to claim 14, wherein the first extension part and the second extension part are located between the first main part and the second main part.

16. The method for forming a layout pattern of a semiconductor cell according to claim 14, wherein the first high electron mobility transistor is located on the first main part, the second high electron mobility transistor is located on the first extension part, the third high electron mobility transistor is located on the second main part, and the fourth high electron mobility transistor is located on the second extension part.

17. The method for forming a layout pattern of a semiconductor cell according to claim 11, wherein the first high electron mobility transistor and the second high electron mobility transistor share a source/drain region, and the third high electron mobility transistor and the fourth high electron mobility transistor share another source/drain region.

18. The method for forming a layout pattern of a semiconductor cell according to claim 11, wherein a gate of the second high electron mobility transistor is connected to a gate of the third high electron mobility transistor.

19. The method for forming a layout pattern of a semiconductor cell according to claim 11, wherein a gate of the first high electron mobility transistor is connected to an input voltage, and a gate of the fourth high electron mobility transistor is connected to an output voltage.

20. The method for forming a layout pattern of a semiconductor cell according to claim 11, further comprising forming a groove around the first L-shaped MESA region and the second L-shaped MESA region.

* * * * *